(12) United States Patent
Cho et al.

(10) Patent No.: US 10,987,619 B2
(45) Date of Patent: Apr. 27, 2021

(54) APPARATUS FOR COLLECTING BY-PRODUCT IN SEMICONDUCTOR MANUFACTURING PROCESS

(71) Applicant: MILAEBO CO., LTD., Pyeongtaek-si (KR)

(72) Inventors: Che Hoo Cho, Seongnam-si (KR); Pyung Hee Son, Seongnam-si (KR); Ye Jin Kim, Bucheon-si (KR); Ji Su Kim, Pyoungtak-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 180 days.

(21) Appl. No.: 16/279,385

(22) Filed: Feb. 19, 2019

(65) Prior Publication Data
US 2020/0164296 A1  May 28, 2020

(30) Foreign Application Priority Data
Nov. 27, 2018 (KR) .................. 10-2018-0148856

(51) Int. Cl.
*B01D 45/00* (2006.01)
*B01D 45/16* (2006.01)
(Continued)

(52) U.S. Cl.
CPC ........ *B01D 45/16* (2013.01); *H01L 21/67017* (2013.01); *B01D 8/00* (2013.01);
(Continued)

(58) Field of Classification Search
CPC .................. B01D 45/16; B01D 53/002; B01D 2258/0216; B01D 45/08; B01D 8/00; H01L 21/67017; C23C 16/00; C23C 16/4412
See application file for complete search history.

(56) References Cited

U.S. PATENT DOCUMENTS 5,820,641 A * 10/1998 Gu ................. B01D 5/0006
55/434.4
6,488,745 B2 * 12/2002 Gu ..................... B01D 8/00
55/434.4
(Continued)

FOREIGN PATENT DOCUMENTS

KR  20-0377501 Y1  3/2005
KR  10-0717837 B1  5/2007
(Continued)

*Primary Examiner* — Dung H Bui
(74) *Attorney, Agent, or Firm* — Rabin & Berdo, P.C.

(57) ABSTRACT

Disclosed is an apparatus for collecting a by-product in a semiconductor manufacturing process. An objective of the present invention is to provide an apparatus for collecting a by-product such that exhaust gas having great amount of light gas is coagulated while having sufficient residence time in a long flow path, whereby the exhaust gas is collected as a high-density by-product. For this purpose, the apparatus includes: a housing receiving and discharging introduced exhaust gas and configured with a horizontal vortex plate; an upper plate covering an upper portion of the housing; an internal collecting tower provided with a collecting tower cover and a seed eliminating fin to extend a flow path and residence time of the exhaust gas; a heater having a heat conduction plate; and an extended discharging pipe configured to extend the flow path and residence time of the exhaust gas and discharge the exhaust gas.

12 Claims, 11 Drawing Sheets

(51) Int. Cl.
  *H01L 21/67* (2006.01)
  *C23C 16/00* (2006.01)
  *B01D 8/00* (2006.01)
  *C23C 16/44* (2006.01)
  *B01D 45/08* (2006.01)
  *B01D 53/00* (2006.01)

(52) U.S. Cl.
  CPC ............ *B01D 45/08* (2013.01); *B01D 53/002* (2013.01); *B01D 2258/0216* (2013.01); *C23C 16/00* (2013.01); *C23C 16/4412* (2013.01)

(56) References Cited

U.S. PATENT DOCUMENTS

| | | | | |
|---|---|---|---|---|
| 8,999,028 | B2* | 4/2015 | Meng | C23C 16/4412 55/434.2 |
| 2002/0139249 | A1* | 10/2002 | Livingston | B01D 45/14 95/270 |
| 2007/0107595 | A1* | 5/2007 | Na | B01D 53/68 95/288 |
| 2009/0217634 | A1* | 9/2009 | Choi | C23C 16/4412 55/426 |
| 2015/0047565 | A1* | 2/2015 | Komori | C23C 16/18 118/724 |
| 2019/0194804 | A1* | 6/2019 | Cho | H01L 21/67098 |
| 2020/0217559 | A1* | 7/2020 | Hwang | F24H 3/00 |
| 2020/0321226 | A1* | 10/2020 | Cho | H01L 21/67017 |

FOREIGN PATENT DOCUMENTS

| | | |
|---|---|---|
| KR | 10-0862684 B1 | 10/2008 |
| KR | 10-1447629 B1 | 10/2014 |
| KR | 10-1673368 B1 | 11/2016 |
| KR | 10-1806480 B1 | 1/2018 |
| KR | 10-1865337 B1 | 7/2018 |

* cited by examiner

APPARATUS FOR COLLECTING BY-PRODUCT IN SEMICONDUCTOR MANUFACTURING PROCESS

CROSS REFERENCE TO RELATED APPLICATION

The present application claims priority to Korean Patent Application No. 10-2018-0148856, filed Nov. 27, 2018, the entire contents of which is incorporated herein for all purposes by this reference.

BACKGROUND OF THE INVENTION

Field of the Invention

The present invention relates to an apparatus for collecting a by-product in a semiconductor manufacturing process. More particularly, the present invention relates to an apparatus for collecting a by-product, the apparatus being configured to solve a problem in which the amount of low-density porous by-product is increased when collecting the by-product because the amount of light gas is great in exhaust gas discharged after used in a process chamber due to changes in a semiconductor manufacturing process, thereby collecting a large amount of high-density by-product.

Description of the Related Art

Generally, a semiconductor manufacturing process is roughly classified into a fabrication process and an assembly process. The fabrication process is a process for manufacturing a chip in which a thin film is deposited on a wafer in various process chambers and a process of selectively etching the deposited thin film is repeatedly performed to process a predetermined pattern. The assembly process is a process of separating the chip manufactured in the fabrication process, and then joining the chip with the lead frame to assemble into the finished product.

Here, a process of depositing a thin film on the wafer or etching a thin film deposited on the wafer is performed at a high temperature by supplying process gases and precursors such as silane, arsine, boron chloride, and hydrogen gas into a process chamber through a gas injection system. During the process, a large amount of various ignitable gases and hazardous gases containing corrosive foreign substances and toxic components are produced in the process chamber.

Therefore, in the semiconductor manufacturing equipment, in order to purify and discharge such hazardous gas, a scrubber for purifying exhaust gas discharged from the process chamber and discharging the exhaust gas to the atmosphere is installed at a rear end of a vacuum pump, which brings the process chamber into a vacuum state.

However, a scrubber only treats and removes by-products in the form of gas. Thus, when by-products are discharged to the outside of the process chamber and then solidified, the powder is adhered to an exhaust line such that an exhaust pressure is raised. In addition, when the powder is introduced into the vacuum pump, the powder causes a failure of the vacuum pump and backflow of the hazardous gas, thereby contaminating a wafer in the process chamber.

Therefore, in semiconductor manufacturing equipment, an apparatus for collecting a by-product is provided between a process chamber and a vacuum pump to coagulate exhaust gas discharged from the process chamber into a powder form.

As illustrated in FIG. 11, in an apparatus for collecting a by-product, a process chamber 51 and a vacuum pump 53 are connected to each other through a pumping line 55, and a trap tube 57 trapping a by-product in a powder form, which is produced in the process chamber 51, is provided at a position branched from the pumping line 55.

However, in the conventional apparatus having the above-described structure, there is a problem in that unreacted gas produced during the deposition or etching of the thin film in the process chamber 51 is introduced toward the pumping line 55 having a relatively low temperature compared with the process chamber 51. Thus, the gas is solidified into powder 59 and accumulated in the trap tube 57, which is provided at a position branched from the pumping line 55.

Accordingly, in order to solve the above-mentioned problems of the related art, the applicant of the present invention has developed "apparatus for collecting by-product in semiconductor manufacturing process" and disclosed the same in Korean Patent No. 10-1806480.

The invention of the applicant has an advantage in that a by-product is collected efficiently in a semiconductor manufacturing process in which the process gases, which are the same as in the related art, are injected. However, recently, with the increase in the amount of light gas in exhaust gas discharged from the process chamber due to changes in the manufacturing process of the manufacturer, the conventional apparatus for collecting a by-product does not provide sufficient conditions such as temperature, flow rate, pressure, flow path, and residence time for solidifying gas into a high-density by-product in an internal collecting tower. Thus, low-density porous powders in collected powders are increased, resulting in a problem that a collecting space is not utilized efficiently and thus the overall collecting efficiency of the apparatus is lowered.

In addition, the conventional apparatus for collecting a by-product has a structural problem in that the porous by-product, which is coagulated in a low density, is discharged directly to a discharging pipe of a lower portion of the apparatus before the flowing gas is solidified into a high density, thereby damaging the vacuum pump.

DOCUMENTS OF RELATED ART (Patent Document 0001) Korean Patent No. 10-0717837, issued on May 7, 2007;
(Patent Document 0002) Korean Patent No. 10-0862684, issued on Oct. 2, 2008;
(Patent Document 0003) Korean Patent No. 10-1447629, issued on Sep. 29, 2014; and
(Patent Document 0004) Korean Patent No. 10-1806480, issued on Dec. 1, 2017

SUMMARY OF THE INVENTION

Accordingly, the present invention has been made keeping in mind the above problems occurring in the related art, and an objective of the present invention is intended to provide an apparatus for collecting a by-product in a semiconductor manufacturing process, the apparatus including: an internal collecting tower provided with a collecting tower cover, which covers an extended discharging pipe, and a seed eliminating fin; and the extended discharging pipe configured to be extended to the inside of the internal collecting tower upwardly in length, such that exhaust gas in which the amount of light gas is great in accordance with changes in the semiconductor manufacturing process is coagulated while having sufficient residence time in a long flow path, whereby the exhaust gas is collected as a high-density by-product.

In addition, another objective of the present invention to provide an apparatus for collecting a by-product in a semiconductor manufacturing process, the apparatus being configured with a vortex plate inclinedly provided on a seed eliminating fin provided around a collecting tower cover in order to generate a vortex such that heavy gas in the exhaust gas is delayed in a space above the internal collecting tower to coagulate the exhaust gas on an upper plate and the seed eliminating fin, whereby the exhaust gas is collected as a high-density by-product.

Furthermore, still another objective of the present invention to provide an apparatus for collecting a by-product in a semiconductor manufacturing process, the apparatus having a heater eccentrically disposed in one side of the housing and a heat conduction plate configured to be extended in a direction away from the heater such that heat is distributed uniformly in an internal collecting tower, whereby the introduced exhaust gas is collected as a high-density by-product.

In order to achieve the above object, there is provided an apparatus for collecting a by-product in a semiconductor manufacturing process, the apparatus being provided on a line between a process chamber and a vacuum pump to collect a by-product in exhaust gas, which is discharged from the process chamber, and the apparatus including: a housing receiving and discharging introduced exhaust gas and configured with a horizontal vortex plate on an inner wall thereof, the horizontal vortex plate generating a vortex; an upper plate covering an upper portion of the housing and having a coolant flow path to maintain an appropriate temperature for protecting an O-ring and for collecting a by-product; an internal collecting tower configured inside the housing to be spaced above the bottom of the housing by a predetermined distance and provided with a collecting tower cover and a seed eliminating fin to extend a flow path and residence time of the exhaust gas in order to coagulate and collect a by-product; a heater having a heat conduction plate to heat and uniformly distribute the exhaust gas flowing into the housing; and an extended discharging pipe configured to be extended to the inside of the internal collecting tower, thereby extending the flow path and residence time of the exhaust gas, and configured to discharge the exhaust gas to a gas outlet of a lower plate of the housing.

The coolant flow path may be provided in a region on the upper plate of the housing, which corresponds to an upper region of the seed eliminating fin provided on the collecting tower cover, to cool the exhaust gas inside the housing.

The heat conduction plate may be configured to be extended toward a housing space portion farther from the heater eccentrically disposed in one side of the housing such that the exhaust gas in a space above the internal collecting tower is heated by the heat conduction plate.

The internal collecting tower may include: the collecting tower cover defining an external shape of the tower; multiple seed eliminating fins provided at predetermined intervals along a circumference of side surfaces of the collecting tower cover to collect a by-product; and an inclined vortex plate assembled with the seed eliminating fins in a cross-set manner to generate a vortex.

The internal collecting tower may include: a lower horizontal supporting plate provided spaced a predetermined distance from the lower plate of the housing, fastened with the collecting tower cover disposed thereon, introducing the exhaust gas into the collecting tower cover while preventing leakage of a low-density porous by-product, and configured such that the extended discharging pipe is inserted in a predetermined position thereof; and a vertical plate and a horizontal plate that are provided in an upper portion of the collecting tower cover of the lower horizontal supporting plate in a lattice form to prevent leakage of the low-density porous by-product of the exhaust gas discharged to the extended discharging pipe, the vertical plate being configured with multiple vertical plate through-holes and the horizontal plate being configured with multiple horizontal plate through-holes.

The collecting tower cover may have a box-shaped structure with the bottom thereof being open such that the collecting tower cover blocks the exhaust gas introduced from the gas inlet from directly flowing toward the gas outlet provided at the lower plate of the housing and the collecting tower cover guides the exhaust gas to flow into an inner space through a bottom opening and multiple side through-holes configured in lower portions of side surfaces of the collecting tower cover.

Inclined slits may be provided in multiple stages at each one side of the seed eliminating fins, and the inclined slits may be configured by cutting obliquely at a predetermined inclination angle such that the inclined vortex plate is inserted therein.

The inclined vortex plate may be configured with multiple slits in a longitudinal direction on a surface thereof, and the inclined vortex plate may be provided in at least one stage on the seed eliminating fin provided on at least one side of short sides and long sides of the collecting tower cover.

When the inclined vortex plate is provided in multiple stages, a lower stage inclined vortex plate may be configured to protrude more outward than an upper stage inclined vortex plate.

The multiple vertical plate through-holes may be configured on the vertical plate such that a vertical plate through-hole provided at a lower portion of the vertical plate is large and a vertical plate through-hole provided at an upper portion thereof is small.

The multiple horizontal plate through-holes may be configured on the horizontal plate such that a horizontal plate through-hole located farther from the extended discharging pipe is large and a horizontal plate through-hole located closer to the extended discharging pipe is small.

At least one of the vertical plate and the horizontal plate may be provided in multiple stages.

The apparatus having the above-described characteristics according to the present invention is characterized in that the vicinity of the extended discharging pipe is covered with the collecting tower cover and the extended discharge pipe configured to be extended upwardly in length from the gas outlet disposed at the bottom of the housing such that the introduced exhaust gas flows to the extended discharge pipe with a long flow path and residence time. Accordingly, the present invention solves a problem of the conventional apparatus in which exhaust gas discharged from a process chamber quickly flows out as a low-density porous by-product through a gas outlet communicating with a vacuum pump directly before the exhaust gas is sufficiently coagulated. Thus, the present invention is advantageous in that a high-density solid by-product can be collected.

In addition, the vortex plate is inclinedly provided on the seed eliminating fin provided around the collecting tower cover to generate a vortex such that the movement of heavy gas in the introduced exhaust gas is delayed and the amount of heavy gas in the exhaust gas is increased, whereby the exhaust gas is coagulated on the upper plate and the upper portion of the seed eliminating fin. Accordingly, the present invention is advantageous in that a high-density solid by-product can be collected efficiently.

In addition, the heat conduction plate extended in a direction away from the heater eccentrically disposed in one side of the housing such that heat is distributed uniformly in the internal collecting tower, whereby the introduced exhaust gas is uniformly coagulated on the upper plate of the internal collecting tower and on the seed eliminating fin and collected as a high-density solid by-product efficiently.

With the above advantages, a replacement period of the apparatus in semiconductor manufacturing equipment can be extended significantly.

Furthermore, the by-product can be rapidly and effectively collected over a long period of time so that the present invention is advantageous in efficiency of collecting various by-products produced in the semiconductor manufacturing process compared with the apparatus for collecting a by-product, which was invented by the applicant of the present invention and registered for a patent. Specifically, the present invention can utilize up to 40% of the total space for collecting a by-product, and the maximum collecting weight is increased to about 40% to 50% as compared with the conventional apparatus.

As described above, according to the present invention, the productivity and reliability of manufactured semiconductors can be greatly improved and thus the present invention is expected to be widely used in industry.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, specific structural and functional descriptions of embodiments of the present invention will be described in detail with reference to the accompanying drawings. In the following description, it is to be noted that, when the functions of conventional elements and the detailed description of elements related with the present invention may make the gist of the present invention unclear, a detailed description of those elements will be omitted.

Figure 1:
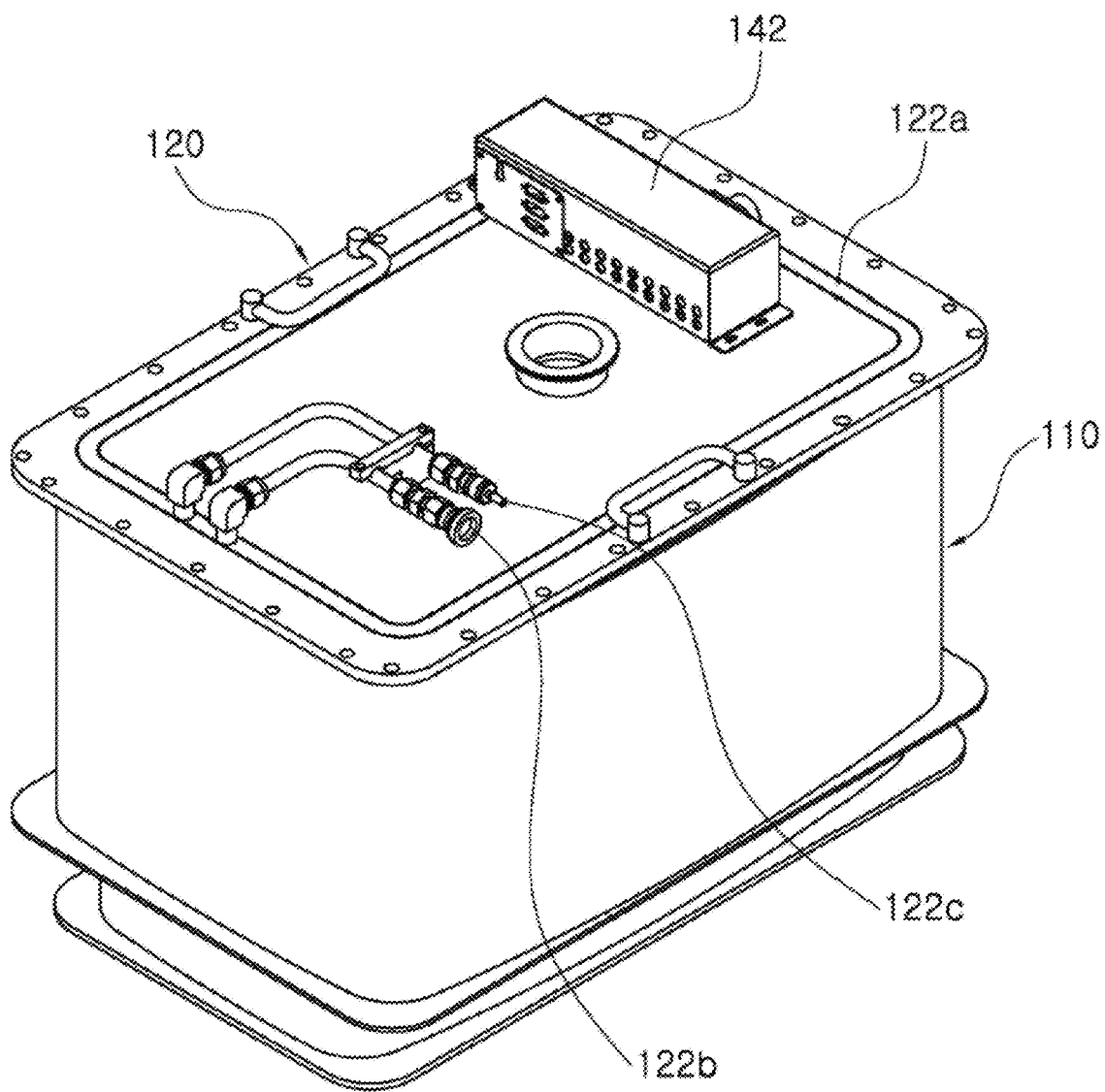
FIG. 1 is a perspective view of an apparatus for collecting a by-product according to an embodiment of the present invention.
Figure 2:
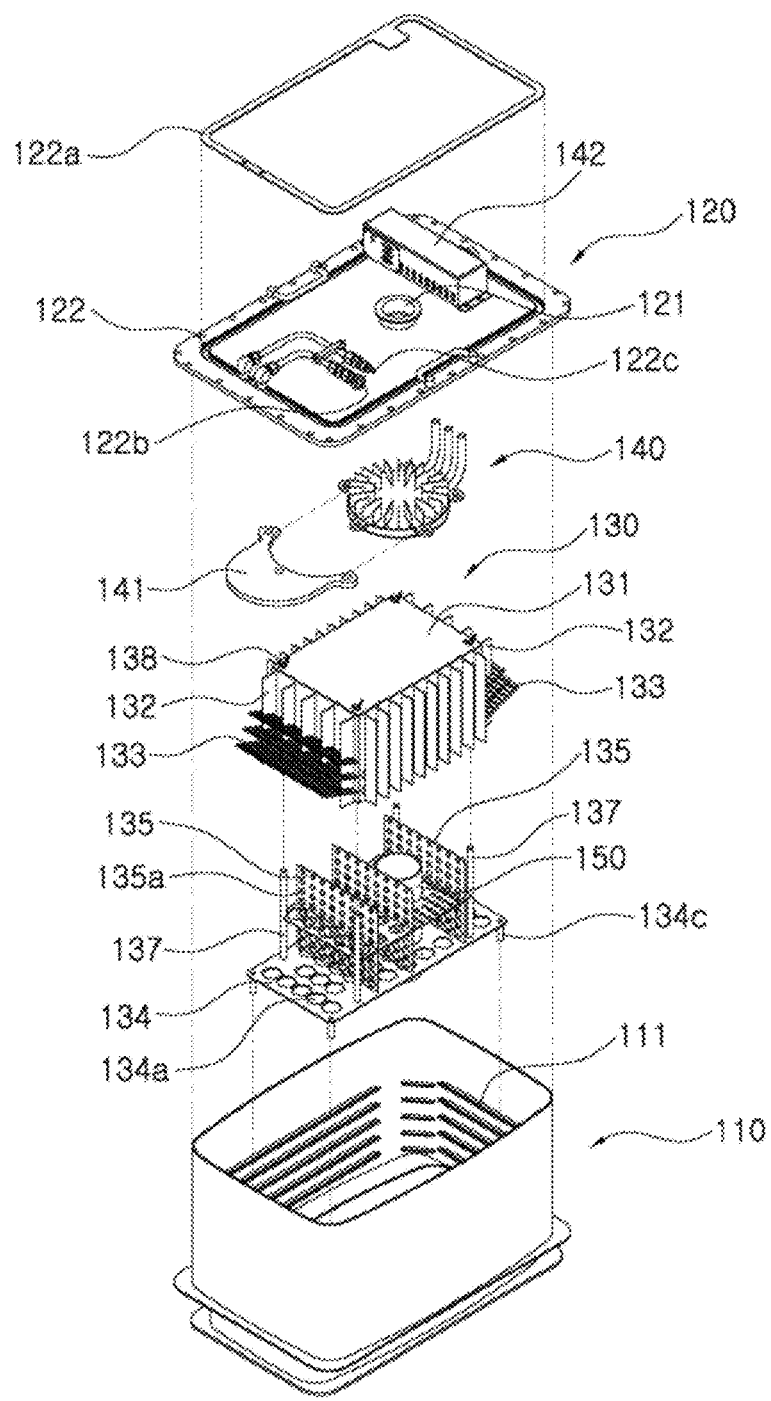
FIG. 2 is an exploded-perspective view of the apparatus for collecting a by-product according to the embodiment of the present invention.
Figure 3:
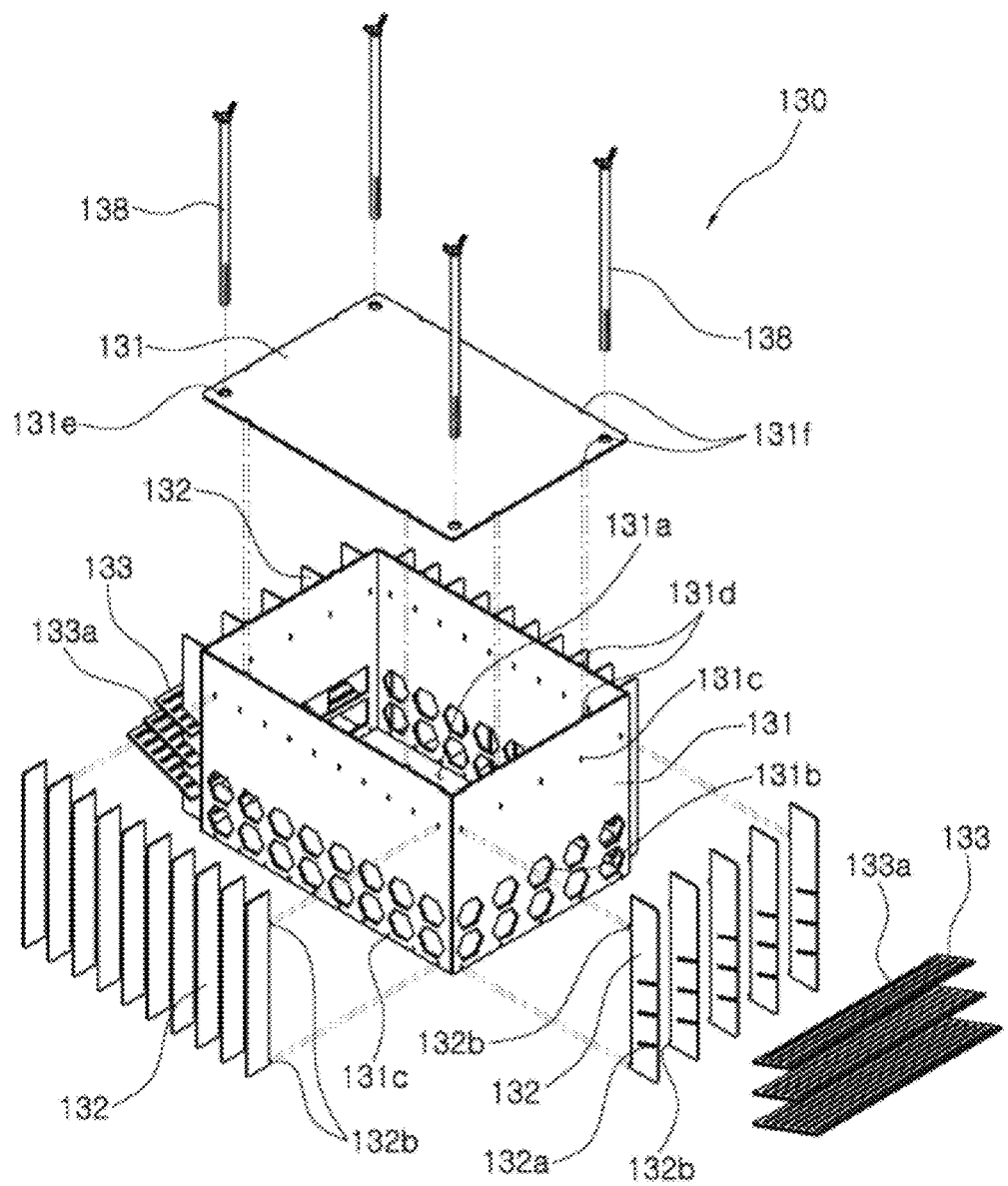
FIG. 3 is an exploded perspective view of an outer configuration of an internal collecting tower according to the embodiment of the present invention.
Figure 4:
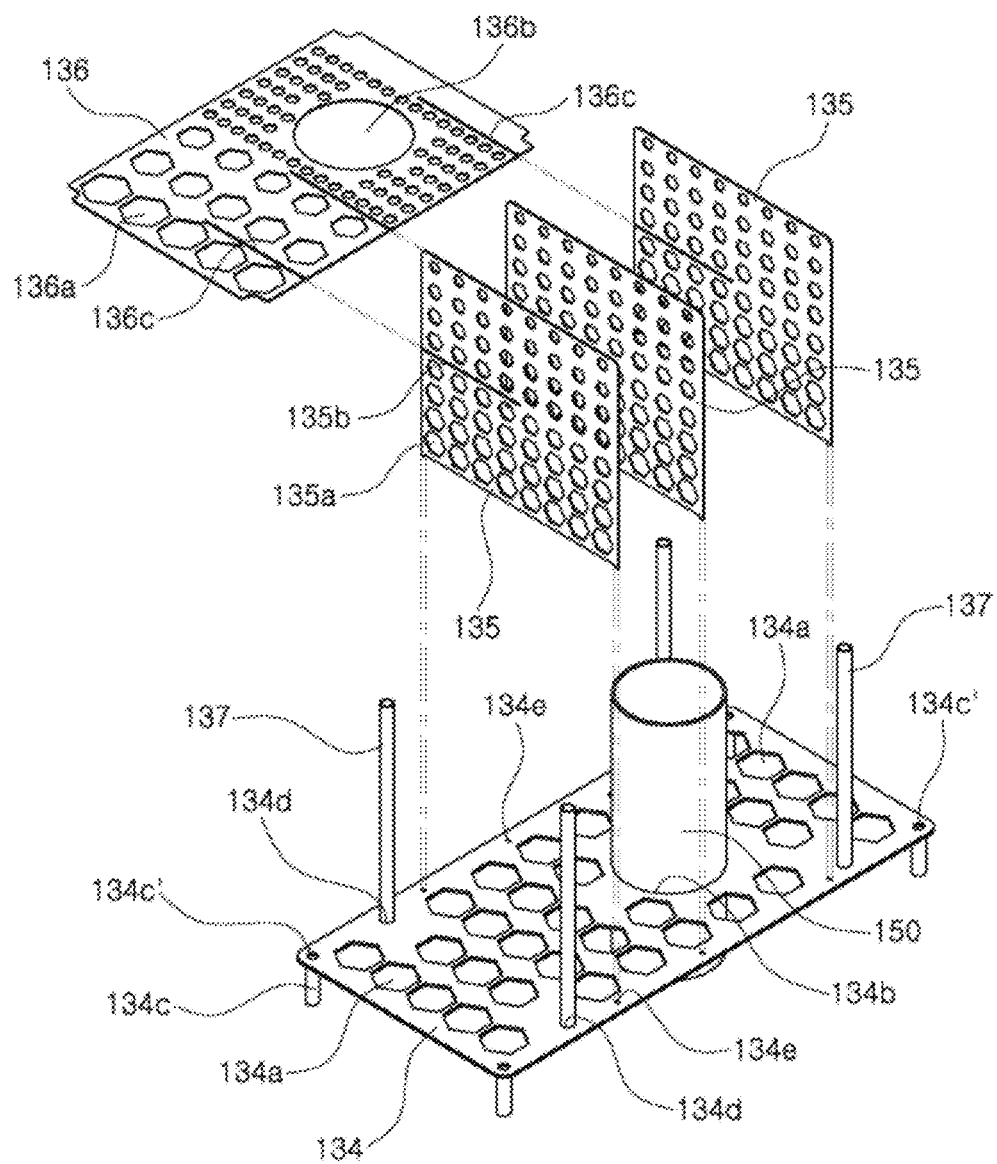
FIG. 4 is an exploded perspective view of an inner configuration of the internal collecting tower according to the embodiment of the present invention.
Figure 5:
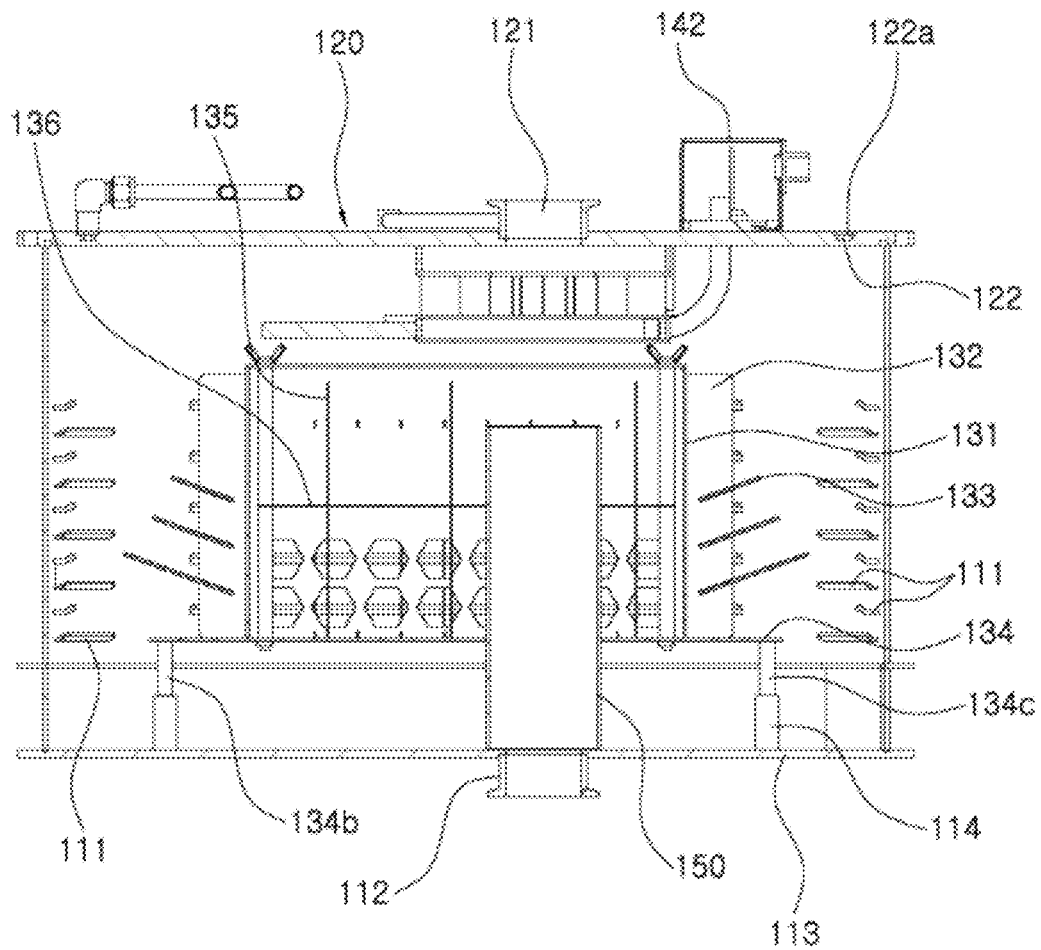
FIG. 5 is a front sectional view of the apparatus for collecting a by-product according to the embodiment of the present invention.

FIG. 1 is a perspective view of an apparatus for collecting a by-product according to an embodiment of the present invention; FIG. 2 is an exploded-perspective view of the apparatus for collecting a by-product according to the embodiment of the present invention; FIG. 3 is an exploded perspective view of an outer configuration of an internal collecting tower according to the embodiment of the present invention; FIG. 4 is an exploded perspective view of an inner configuration of the internal collecting tower according to the embodiment of the present invention; and FIG. 5 is a front sectional view of the apparatus for collecting a by-product according to the embodiment of the present invention.

As illustrated in the figures, the apparatus for collecting a by-product in a semiconductor manufacturing process according to the present invention coagulates harmful gas into a byproduct, which is contained in exhaust gas discharged from a process chamber during the semiconductor manufacturing process, collects the by-product to purify the exhaust gas, and discharges the exhaust gas to the vacuum pump. Particularly, there is a problem in that, when using a conventional collecting apparatus, the amount of light gas in exhaust gas discharged after used in a process chamber is increased due to changes in a semiconductor manufacturing process. Accordingly, the apparatus according to the present invention is configured to solve the problem such that a high-density by-product is coagulated and collected efficiently.

The apparatus for collecting a by-product in a semiconductor manufacturing process according to the present invention includes: a housing 110 receiving and discharging an introduced exhaust gas and configured with horizontal vortex plates on an inner wall thereof, the horizontal vortex plate generating a vortex; an upper plate 120 covering an upper portion of the housing and having a coolant flow path to maintain an appropriate temperature for protecting an 0-ring and for collecting a by-product; an internal collecting tower 130 configured inside the housing to be spaced a predetermined distance above the bottom of the housing and provided with a collecting tower cover and seed eliminating fins to extend a flow path and residence time of the exhaust gas in order to coagulate and collect a by-product; a heater 140 having a heat conduction plate to heat and uniformly distribute the exhaust gas flowing into the housing; and an extended discharging pipe 150 configured to extend to the inside of the internal collecting tower to extend the flow path and residence time of the exhaust gas and configured to discharge the exhaust gas to a gas outlet of a lower plate of the housing.

In order to prevent corrosion caused by the exhaust gas discharged from the process chamber, most components of the apparatus for collecting a by-product according to the present invention are made of a material such as titanium, stainless steel, and aluminum, which prevent corrosion.

Hereinafter, each component of the apparatus for collecting a by-product will be described in detail.

The housing 110 is formed into a hollow rectangular shape and configured to store the exhaust gas such that the exhaust gas flowing into the internal collecting tower provided in the housing 110 is coagulated and collected. The upper portion of the housing 110 is opened to accommodate the internal collecting tower and then covered with the upper plate and fastened with fastening means such as bolts.

On the inner wall of the housing, the multiple horizontal vortex plates 111 are configured along a circumference of the inner wall in a protruding manner and provided in multiple stages. The individual horizontal vortex plates 111 may be configured to be extended in the horizontal direction at the same height or may be configured to be segmented and offset from a horizontal vortex plate of an adjacent surface to have different heights with each other. The horizontal vortex plates 111 formed on the individual surfaces are spaced a predetermined distance apart from each other in the vertical direction and provided in multiple stages.

The horizontal vortex plate 111 generates a vortex when colliding with the exhaust gas flowing into the housing such that the residence time of the exhaust gas is increased and thus the by-product collecting efficiency is increased. That is, the horizontal vortex plates provided on the inner wall of the housing, which is in direct contact with the outside air having a temperature lower than the internal temperature of the housing, are cooled by heat transfer of the outside air such that the exhaust gas delayed by the vortex is coagulated and collected.

A shape of the horizontal vortex plate 111 is not limited to the basic shape in which the horizontal vortex plate 111 protrudes horizontally in the inward direction. Alternatively, the horizontal vortex plate 111 may be shaped such that a protruding end portion is bent at a predetermined angle in the upper or lower direction, or is curved to generate a bigger vortex.

An opening is formed at a portion in the lower plate 113 constituting a lower part of the housing such that the gas outlet 112 is fixed to the outer side by welding or the like to be used as a passage through which the exhaust gas from which a by-product is removed is discharged. Here, the extended discharging pipe 150 is provided in an upper surface of the lower plate of the housing, which comes in contact with the gas outlet 112, such that the exhaust gas passing through the internal collecting tower 130 is discharged to the gas outlet 112 with a long flow path.

In addition, supporters 114 are provided on multiple positions of the lower plate of the housing such that the internal collecting tower 130 is spaced above from the lower plate at a predetermined distance and fixedly supported by the supporters 114. A lower supporter 134b provided on a lower horizontal supporting plate 134 of the internal collecting tower 130 is inserted and fastened to the supporter 114. The fastening between the supporter 114 and the lower supporter 134b may be simply fitted, fastened using a fastening member such as a bolt, or fastened by various other known fastening methods.

The upper plate 120 serves as a cover for covering the upper portion of the opened upper portion of the housing and prevents deterioration of functions such as preventing the O-ring (not illustrated) provided at the lower portion of the upper plate from being deformed when the housing inner space is heated by operation of the heater provided on the lower surface of the upper plate 120. In addition, the upper plate 120 is configured with the coolant flow path 122 formed into a groove shape on the upper surface thereof to maintain an appropriate temperature for collecting a by-product. An upper part of the coolant flow path formed into a groove is configured to be closed by a flow path cover 122a. At this time, although the lid cover is shown, the flow path cover may be fastened by sealing for water tightness, and the fastening method may be achieved by known techniques such as fitting, welding, bolt fastening, and the like.

The coolant flow path 122 is configured such that coolant supplied from an external coolant tank (not illustrated) is circulated such that the coolant flows through a coolant inlet 122b and then is discharged through a coolant outlet 122c. The coolant flow path is configured to have a boundary portion such that ends thereof do not communicate with each other and thus supplied coolant and discharged coolant are not mixed with each other. The coolant may be water or a refrigerant. The coolant flow path 122 constructed above is configured such that a cooling area of the upper plate is reduced by a factor of about 3.5 compared with a cooling area formed on an upper plate of an apparatus for collecting a by-product of the related art, which was which was invented by the applicant of the present invention and registered for a patent, whereby a by-product collecting area is enlarged compared with that of the related art. Therefore, it is possible to cool the upper plate on which the coolant flow path 122 is formed to maintain an effective collecting temperature ranging from 60° C. to 140° C. A lower region of the region where the coolant flow path 122 is formed corresponds to an upper region of the seed eliminating fins provided on the collecting tower cover constituting the outside of the internal collecting tower to be described later, thus providing an excellent efficiency for cooling the exhaust gas.

In addition, the upper plate is configured with a gas inlet 121 protruding upwardly at a punctured position through which the exhaust gas is to be inflown, and the gas inlet 121 is formed by welding or the like to be fixed, such that the exhaust gas discharged from the process chamber flows therethrough. A position of the gas inlet 121 is eccentrically biased to one side of the central portion as illustrated in one embodiment. When providing the gas inlet 121 as described above, the exhaust gas flowing into the inside of the housing flows eccentrically inside the housing. The reason why the gas inlet 121 is provided eccentrically is to provide a relatively large space portion on the opposite side compared with the one side where the gas inlet is formed in the housing in order to collect a by-product.

In addition, a heater power supply unit 142 is provided on the upper plate, the heater power supply unit 142 supplying power to the heater provided on the bottom surface thereof and having a temperature sensor measuring temperature to control the power supply according to the internal temperature.

The internal collecting tower 130 is accommodated and provided in the housing. The internal collecting tower 130 coagulates and collects a by-product with the extended discharging pipe 150, which is provided for the same purpose, while extending the flow path and residence time of the exhaust gas introduced.

Specifically, the internal collecting tower 130 includes: the collecting tower cover defining an external shape of the internal collecting tower 130; the multiple seed eliminating fins 132 provided at predetermined intervals along a circumference of side surfaces of the collecting tower cover to collect a by-product; inclined vortex plates 133 assembled with the seed eliminating fins in a cross-set manner to generate a vortex; the lower horizontal supporting plate 134 provided spaced a predetermined distance from the lower plate of the housing, fastened with the collecting tower cover 131 disposed thereon, introducing the exhaust gas into the collecting tower cover 131 while preventing leakage of a low-density porous by-product, and configured such that the extended discharging pipe 150 is inserted in a predetermined position thereof; and vertical plates 135 and a horizontal plate 136 provided in an upper portion of the collecting tower cover provided on the lower horizontal supporting plate in a lattice form to prevent leakage of the low-density porous by-product of the exhaust gas discharged to the extended discharging pipe 150.

The collecting tower cover 131 has a box-shaped structure with the bottom thereof opened such that the collecting tower cover 131 blocks the exhaust gas introduced from the gas inlet directly from flowing toward the gas outlet provided at the lower plate of the housing and the collecting tower cover 131 guides the exhaust gas to flow into the inner space through a bottom opening 131a and multiple side through-holes 131b configured in lower portions of side surfaces.

The collecting tower cover 131 is configured such that the upper surface member thereof is supported by the side surface members thereof defining the periphery of the collecting tower cover 131. The members are pressed and fastened by support rods 137 of the lower horizontal supporting plate 134 and bolts 138. To this end, engaging recesses 131f are formed around the upper surface and engaging protrusions 131d are formed on the upper portion of each side surface at positions corresponding to the engaging recesses 131f. In addition, multiple engaging holes 131e through which the bolts 138 are inserted are formed on the upper surface. The bolts inserted through the engaging holes are inserted into the support rods 137 formed on the lower horizontal supporting plate 134 and fastened such that threads formed on lower portions of the bolts are screwed with inner threads (not illustrated) of the support rods.

In addition, multiple seed eliminating fin engaging recesses 131c are formed on the upper and lower portions of the side surfaces at regular intervals. The seed eliminating fins 132 are inserted and fastened to the engaging recesses. Additionally, the seed eliminating fins and the engaging recesses may be integrated as one body by welding or the like in a state of being fastened in the inserted manner.

The multiple seed eliminating fins 132 are provided along the periphery of the sides of the collecting tower cover at regular intervals to uniformly divide downflow channels of the exhaust gas such that contact area is increased and thus the by-product is coagulated and collected in high density. The reason why the seed eliminating fins 132 are provided is that, when only the collecting tower cover is provided, the efficiency of coagulating the exhaust gas by surface contact. However, when the seed eliminating fins 132 are provided in a protruding manner, the exhaust gas is coagulated more by the edge effect.

The seed eliminating fins 132 are configured with seed eliminating fin engaging protrusions 132b at the upper and lower portions thereof, the seed eliminating fin engaging protrusions 132b being inserted into the seed eliminating fin engaging recesses formed in the collecting tower cover. In addition, inclined slits 132a are provided in multiple stages at each one side of the seed eliminating fins. The inclined slits 132a are configured by cutting obliquely at a predetermined inclination angle such that the inclined vortex plates 133 are inserted therein. Accordingly, the inclined vortex plates 133 are inserted in the inclined slits 132a formed in the multiple seed eliminating fins such that the inclined vortex plates 133 are stably assembled.

Although the inclined slits 132a formed in the seed eliminating fins 132 are illustrated as being formed only on the seed eliminating fins 132 provided on short sides of the collecting tower cover, it is obvious that the inclined slits 132a may be formed in all of the seed eliminating fins including seed eliminating fins provided on long sides of the collecting tower cover.

The inclined vortex plates 133 are assembled obliquely at a predetermined inclination angle in the transverse direction by being cross-set on the seed eliminating fins in order to generate vortex in the exhaust gas flowing downward such that heavy gases in the exhaust gas stay in the upper portion of the collecting tower cover.

The inclined vortex plates 133 are provided in multiple stages. The inclined vortex plates 133 are formed in the opposite seed eliminating fins provided on the short sides of the collecting tower cover 131 as an embodiment illustrated in the figures. However, it is obvious that the inclined vortex plates 133 may be formed on all of the seed eliminating fins 132 including the seed eliminating fins 132 provided on the long sides of the collecting tower cover 131.

In addition, the inclined vortex plates 133 may be provided in a single stage or multiple stages. When the inclined vortex plates 133 are provided in multiple stages, it is preferable that a lower stage inclined vortex plate is configured to protrude more outward than an upper stage inclined vortex plate. When the lower stage and the upper stage have the same protruding length, the lower stage contributes less than the upper stage in generating vortex. However, when the lower stage has a longer protruding length, the lower stage may generate vortex in the exhaust gas flowing outside the upper stage.

In addition, the inclined vortex plates 133 are configured with multiple slits 133a in the longitudinal direction on surfaces thereof. When the slits are provided, the slits function to supply the exhaust gas to another vortex plate disposed below the upper vortex plate as some of the exhaust gas flows downward therethrough, whereby a larger vortex is generated. Another reason why the slits are provided is that the slits guide the exhaust gas to come into contact with the seed eliminating fin such that the by-product is coagulated in the space where the inclined vortex plates 133 are disposed. When the surface of the inclined vortex plate is completely blocked instead of being configured with the slits, the supply of the exhaust gas newly introduced into space between adjacent inclined vortex plates becomes small such that the amount of coagulated exhaust gas on a corresponding seed eliminating fin is small, whereby the overall efficiency of collecting a by-product may be lowered. Another reason why the slits are provided is that the slits may be used as a path for allowing the exhaust gas from which a by-product is removed to flow into the collecting tower cover.

The reason why the inclined vortex plates 133 are provided even though the horizontal vortex plates 111 are provided on the inner wall of the housing is to delay the flow of the exhaust gas. Even though the horizontal vortex plates 111 have the advantage of swirling the exhaust gas flowing along the inner wall, the efficiency of generating vortex in the exhaust gas flowing along the outside of the collecting tower cover 131 by the horizontal vortex plate 111 is lowered, and the exhaust gas tends to flow faster along the collecting tower cover 131. Accordingly, it is required to provide the inclined vortex plates 133 to delay the flow of the introduced exhaust gas.

The lower horizontal supporting plate 134 is provided spaced a predetermined distance from the lower plate of the housing and is fastened with the collecting tower cover 131 disposed thereon. In addition, the lower horizontal supporting plate 134 introduces the exhaust gas into the collecting tower cover 131 while preventing leakage of a low-density porous by-product. In addition, the lower horizontal supporting plate 134 is configured such that the extended discharging pipe 150 is inserted in a predetermined position thereof.

Furthermore, the lower horizontal supporting plate 134 is provided with support members 134d at a lower portion thereof, the support members 134d being inserted into the supporters 114, which are provided on the lower plate of the housing to space the lower horizontal supporting plate 134 above from the lower plate of the housing at a predetermined distance. The support members 134d are fastened by bolts or the like through support member engaging holes 134c' formed in the lower horizontal supporting plate 134.

The support rods 137 are provided on the upper side to fasten the collecting tower cover 131 disposed at the upper portion. The support rods may be fixed by bolts disposed at the lower portion or fixed by welding or the like.

In addition, multiple through-holes 134a are formed in the surface of the lower horizontal supporting plate 134 to prevent a low-density by-product of the exhaust gas from flowing into the collecting tower cover 131. Thus, the exhaust gas flows into the collecting tower only through the through-holes.

In addition, an opening 134b into which the extended discharging pipe 150 is inserted and supported is formed at a predetermined position of the lower horizontal supporting plate 134, that is, at an eccentric position.

In addition, multiple engaging recesses 134e are formed in a manner that the multiple engaging recesses 134e extend from one surface to the opposite surface of the lower horizontal supporting plate 134 vertically. Engaging protrusions provided on lower portions of the vertical plates are inserted and supported by the multiple engaging recesses 134e.

The vertical plates 135 are configured to be perpendicularly engaged with the lower horizontal supporting plate 134 in a cross-set manner to prevent a low-density by-product from being discharged from the collecting tower cover 131. For this purpose, multiple vertical plate through-holes 135a are formed in surfaces of the vertical plates 135.

Here, vertical plate through-holes at lower portions of the vertical plates are large and vertical plate through-holes at upper portions of the vertical plates are small such that it is difficult for a low-density by-product to escape through the extended discharging pipe 150. It is obvious that the vertical plates serve to coagulate and collect both the high-density porous by-product and the low-density porous by-product thereon. However, the amount of by-product to be collected on the vertical plates is negligibly small because the by-product is mostly collected on the seed eliminating fin 132.

Meanwhile, the vertical plate 135 is configured with a fitting slit 135b cut in a predetermined length on a side surface thereof such that the horizontal plate is fitted in the fitting slit 135b laterally.

The vertical plates 135 are provided in multiple stages to prevent the escape of the low-density by-product in the introduced exhaust gas. The number of the vertical plates 135 is not limited to a specific number in the present invention.

The horizontal plate 136 is horizontally engaged with the vertical plates in a cross-set manner to prevent the low-density by-product in the exhaust gas from being discharged from the collecting tower cover 131 as the lower horizontal supporting plate 134 and the vertical plate 135 serve. For this purpose, multiple horizontal plate through-holes 136a are formed in a surface of the horizontal plate 136.

Here, horizontal plate through-holes located farther from the extended discharging pipe 150 are large and horizontal plate through-holes located closer to the extended discharging pipe 150 are small such that it is difficult for the low-density by-product to escape through the extended discharging pipe 150. It is obvious that the horizontal plate serves to coagulate and collect both the high-density porous by-product and the low-density porous by-product thereon. However, the amount of by-product to be collected on the horizontal plate is negligibly small because the by-product is mostly collected on the seed eliminating fin 132.

Meanwhile, the horizontal plate 136 is configured with a fitting slit 136d cut in a predetermined length on a side surface thereof such that the vertical plates are fitted in the fitting slit 135b laterally.

In addition, an opening 136b into which the extended discharging pipe 150 is inserted and supported is formed at a predetermined position of the horizontal plate 136, that is, at an eccentric position as the opening 134b of the lower horizontal supporting plate is.

Multiple horizontal plates 136 may be provided in multiple stages as the vertical plates are.

The extended discharging pipe 150 is configured as a flow path such that the exhaust gas flowing into the housing through the gas inlet of the upper plate covering the top of the housing is not discharged directly to the gas outlet but flows through the bottom opening 131a of the collecting tower cover constituting the outside of the internal collecting tower and the multiple side through-holes 131b configured in the lower portions of the side surfaces, reaches an upper portion of the extended discharging pipe 150, descends, and is discharged through the gas outlet 112.

As the exhaust gas flowing into the collecting tower cover passes through the through-holes 134a of the lower horizontal supporting plate 134 supporting the bottom of the collecting tower cover, through the vertical plate through-holes 135a of the vertical plates 135 provided on the lower horizontal supporting plate 134, and through the horizontal plate through-holes 136a of the horizontal plate 136 cross-set with the vertical plates 135, the low-density porous by-product is removed from the exhaust gas. Then, the exhaust gas reaches the upper portion of the extended discharging pipe 150.

As described above, the lower horizontal supporting plate 134, the vertical plate 135, and the horizontal plate 136 are configured in multiple grid arrangements inside the collecting tower cover to minimize the discharge of the low-density porous by-product and to discharge only purified exhaust gas, the low-density porous by-product being coagulated at a low temperature as the exhaust gas moves away from the heater.

The heater 140 is attached to come into contact with the bottom surface of the gas inlet 121 configured in the upper plate by a fastening method such as bolt or welding such that the exhaust gas introduced into the housing is heated. When the power is supplied to the heater 140 from the heater power supply unit 142 having the temperature sensor and provided on the upper surface of the upper plate, the heater generates heat of a predetermined temperature, for example, 250° C. The heater is made of a material such as ceramic or inconel to prevent corrosion caused by the exhaust gas. A basic shape of the heater is a configuration in which multiple radiating fins are radially arranged with respect to the vertical direction such that a uniform heat source is radiated.

The heater serves to prevent coagulation of the exhaust gas discharged from the process chamber right after the exhaust gas is introduced through the gas inlet 121 configured in the upper plate of the housing such that the gas inlet 121 is not clogged and to maximize the coagulation of the exhaust gas when the exhaust gas reaches the internal collecting tower. In addition, the heater serves to supply heat evenly to the space surrounding the collecting tower cover constituting the outside of the internal collecting tower through the structure of the radiating fins arranged radially such that the exhaust gas is coagulated evenly. For reference, as gas, which is unreacted in the process chamber, of the exhaust gas introduced through the gas inlet 121 is heated by the heater, a chemical change of the gas occurs due to the secondary reaction. Immediately thereafter, the gas becomes a film form instantaneously and is coagulated after contact with the surface of the internal collecting tower cooled to a low temperature. A remaining by-product of the exhaust gas becomes a powder form and then is coagulated and collected on the surface of the internal collecting tower.

In particular, the heater 140 of the present invention is different from a heater provided in the conventional apparatus for collecting a by-product in that the heater 140 further includes a heat conduction plate 141 being extended toward the other housing space farther from the heater 140 eccentrically disposed in one side of the housing. The heat conduction plate may be provided detachably by a bolt fastening method or the like. To this end, nut holes are vertically configured in the heater at predetermined intervals. In correspondence thereto, nut recesses are configured at opposite ends of a semicircular recess configured in one side of the heat conduction plate corresponding to the outer diameter of the heater. Accordingly, after determining an appropriate mounting point, the nut holes and the nut recesses are axially aligned, and then the heater and the heat conduction plate are fastened by bolts and nuts.

The reason why the heat conduction plate 141 is further provided will be described in detail hereinbelow. In the conventional apparatus, there is an advantage in securing space due to a structure of the heater eccentrically disposed on one side of the housing in order to secure a large collecting space. However, in accordance with changes in a semiconductor manufacturing process, the amount of light gas contained in the exhaust gas discharged from the process chamber is greater than the amount of heavy gas. Accordingly, there is a problem in that the temperature of the exhaust gas farther from the heater is cooled faster than the exhaust gas close to the heater such that, before a by-product is coagulated on the seed eliminating fins provided around the collecting tower cover, a by-product is coagulated in a high-density by-product on a part of the upper plate far from the heater and blocks a flow path of the space portion, or a low-density porous by-product is coagulated and blocks the flow path of the space portion when the temperature is low. To prevent the problem, the heat conduction plate 141 is further provided.

An appropriate temperature range at which the high-density by-product is coagulated is 60° C. to 140° C. However, when the heat conduction plate is not provided, a by-product may be coagulated on a part of an upper surface of the collecting tower cover away from the eccentrically disposed heater and block the space portion before the seed eliminating fins provided around the collecting tower cover reaches the temperature range. Furthermore, when the temperature is equal to or lower than 60° C., a low-density porous by-product may be coagulated on the part of the upper surface of the collecting tower cover and block the space portion. As a result, the by-product is collected unevenly in which the coagulation of by-product occurs less on a part of the seed eliminating fins provided around the collecting tower cover or the coagulation of by-product occurs only near the heater, whereby the collecting efficiency of the internal collecting tower is drastically lowered.

However, according to the present invention, about 250° C. of heat generated by the heater is distributed by the heat conduction plate such that the temperature range of 140° C. to 160° C. in which the by-product is not collected on the entire area of the upper surface of the collecting tower cover is provided evenly. Then, the exhaust gas reaches the temperature range of 60° C. to 140° C. on a section in which the exhaust gas reaches the seed eliminating fins provided around the collecting tower cover and descends, and then starts to be collected as a high-density by-product. Therefore, in the present invention, most of the heavy gas in the exhaust gas is coagulated as a high-density by-product on upper regions of the seed eliminating fins.

When the heat generated by the heater is 250° C., the heat is conducted to the heat conduction plate in a range of 180° C. to 220° C. such that the entire area of the upper surface of the collecting tower cover becomes in a range of 140° C. to 160° C.

The extended discharging pipe 150 is provided in the housing and is configured to discharge the introduced exhaust gas to the gas outlet while extending the flow path and the residence time of the exhaust gas. The extended discharging pipe 150 is configured such that a bottom portion thereof comes into contact with the upper surface of the gas outlet 112 provided on the bottom surface of the lower plate of the housing to keep airtightness and an upper portion thereof is extended into the interior of the internal collecting tower.

The extended discharging pipe 150 is configured as a flow path such that the exhaust gas flowing into the housing through the gas inlet of the upper plate covering the top of the housing is not discharged directly to the gas outlet but flows through the bottom opening 131*a* of the collecting tower cover constituting the outside of the internal collecting tower and the multiple side through-holes 131*b* configured in the lower portions of the side surfaces, reaches an upper portion of the extended discharging pipe 150, descends, and is discharged through the gas outlet 112.

The exhaust gas flowing into the collecting tower cover passes through the through-holes 134*a* of the lower horizontal supporting plate 134 supporting the bottom of the collecting tower cover, through the horizontal plate through-holes 136*a* of the horizontal plate 136 spaced a predetermined distance above from the lower horizontal supporting plate 134, and through the vertical plate through-holes 135*a* of the vertical plates 135 provided on the horizontal plate 136, and then the exhaust gas reaches the upper portion of the extended discharging pipe 150. As described above, the lower horizontal supporting plate 134, the vertical plate 135, and the horizontal plate 136 are configured in multiple grid arrangements inside the collecting tower cover to minimize the discharge of the low-density porous by-product that is coagulated at a low temperature as the exhaust gas moves away from the heater.

Figure 6:
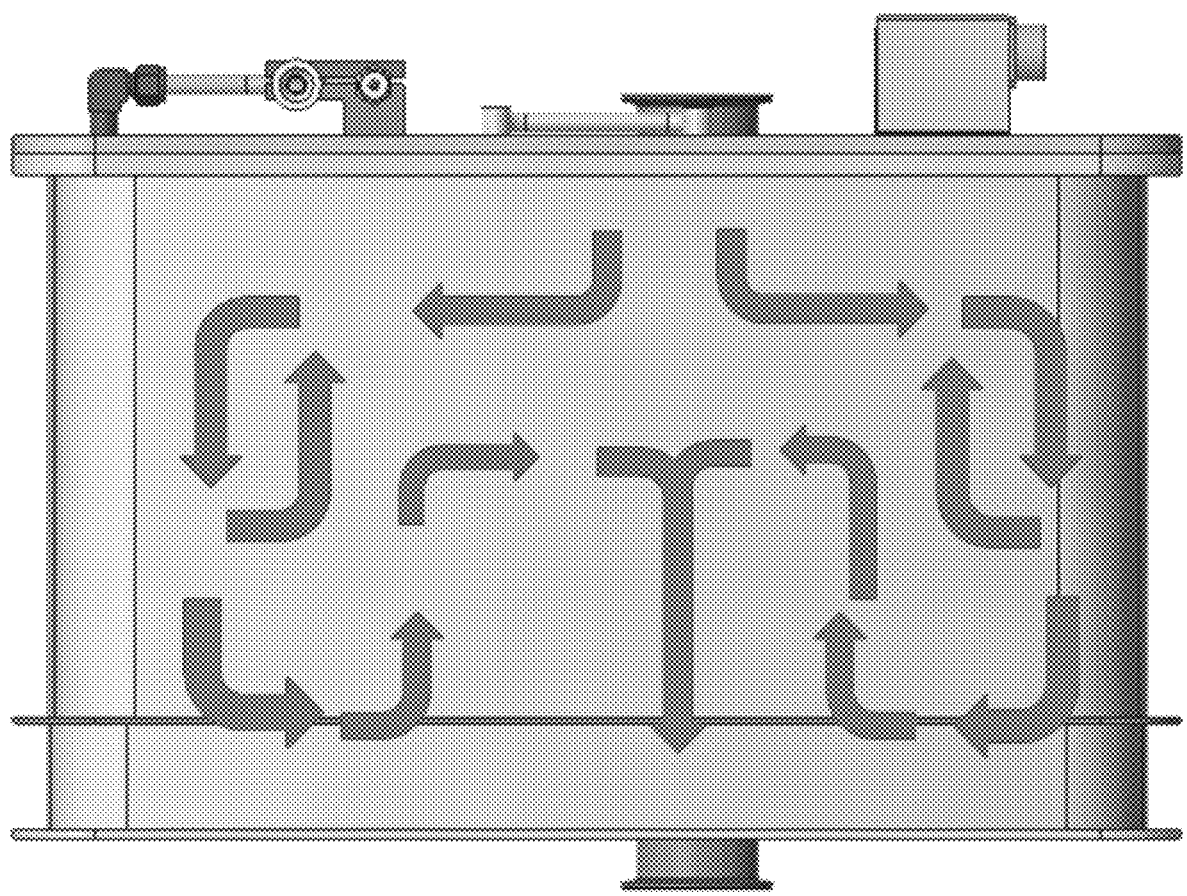
FIG. 6 is an exemplary view of a gas flow inside the apparatus for collecting a by-product according to the embodiment of the present invention.
Figure 7:
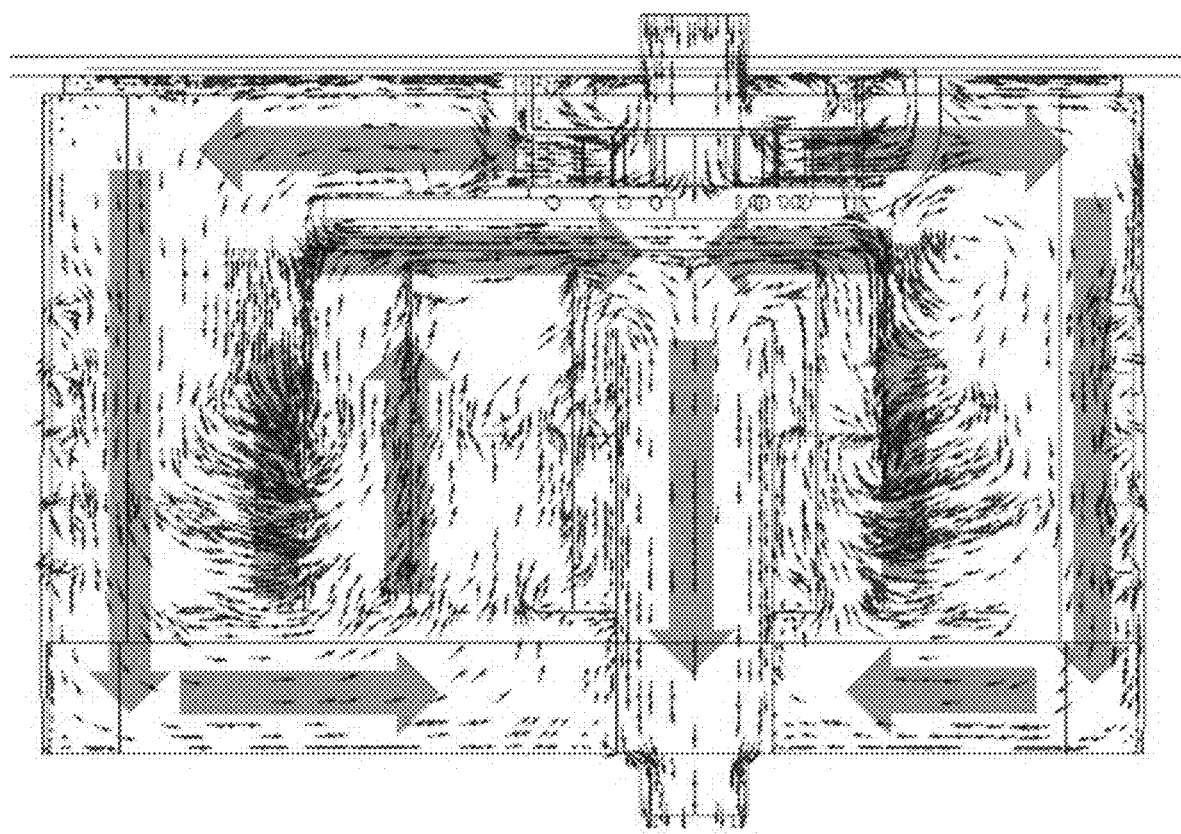
FIG. 7 is a view illustrating a flow velocity distribution inside the apparatus for collecting a by-product according to the embodiment of the present invention.

FIG. 6 is an exemplary view of a gas flow inside the apparatus for collecting a by-product according to the embodiment of the present invention; and FIG. 7 is a view illustrating a flow velocity distribution inside the apparatus for collecting a by-product according to the embodiment of the present invention. In the figures, the exhaust gas flowing through the gas inlet of the upper plate of the housing is uniformly distributed by the heater and descends along the periphery of the collecting tower cover of the internal collecting tower. Thereafter, vortex is generated, leading to delay of the exhaust gas. Then, the exhaust gas flows into the internal collecting tower through the sides and the bottom of the collecting tower cover, ascends, and flows into the extended discharging pipe. Then, the exhaust gas descends again and is discharged through the gas outlet of the lower plate of the housing, which communicates with the extended discharging pipe.

Figure 8:
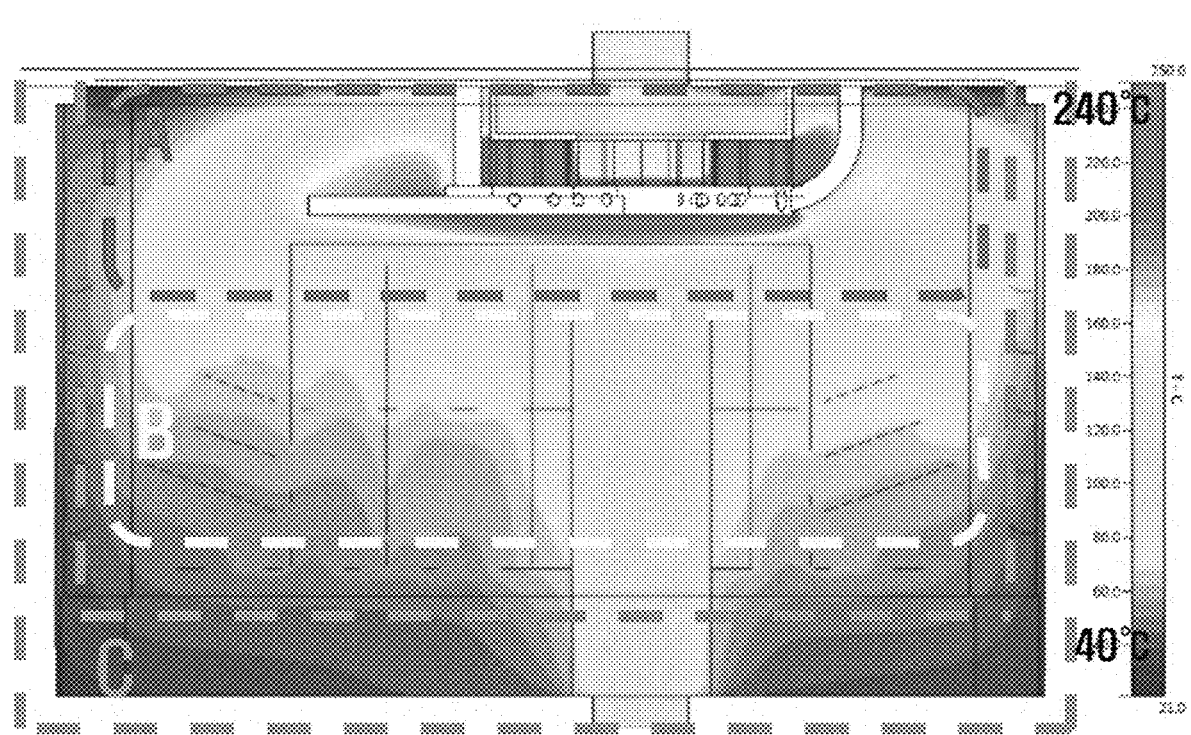
FIG. 8 is a view illustrating a temperature distribution inside the apparatus for collecting a by-product according to the embodiment of the present invention.
Figure 9:
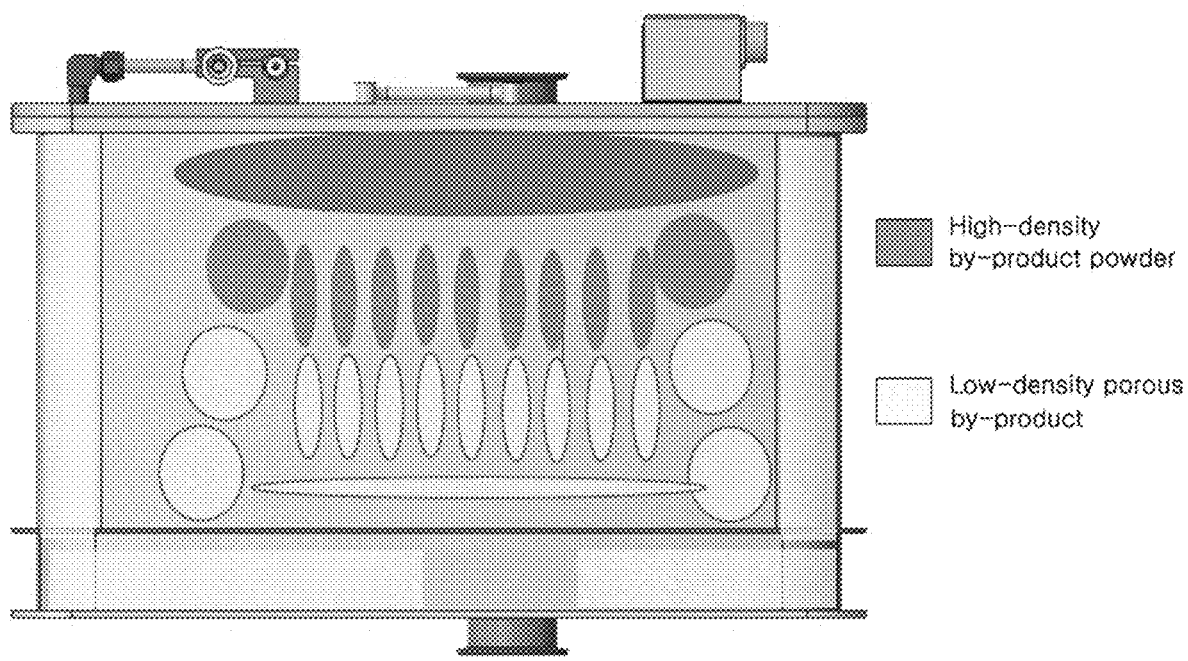
FIG. 9 is a view illustrating a collecting tendency inside the apparatus for collecting a by-product according to the embodiment of the present invention.
Figure 10:
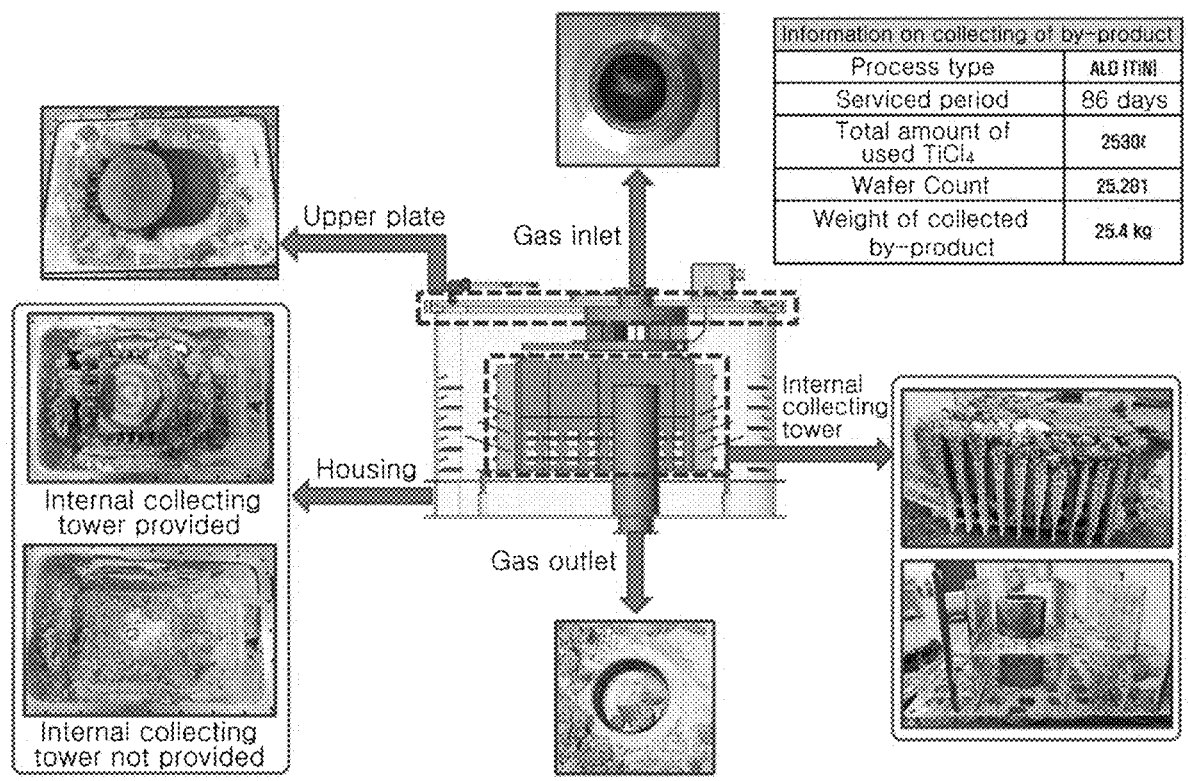
FIG. 10 shows photographs of collected by-products in different regions of the apparatus for collecting a by-product according to the embodiment of the present invention.
Figure 11:
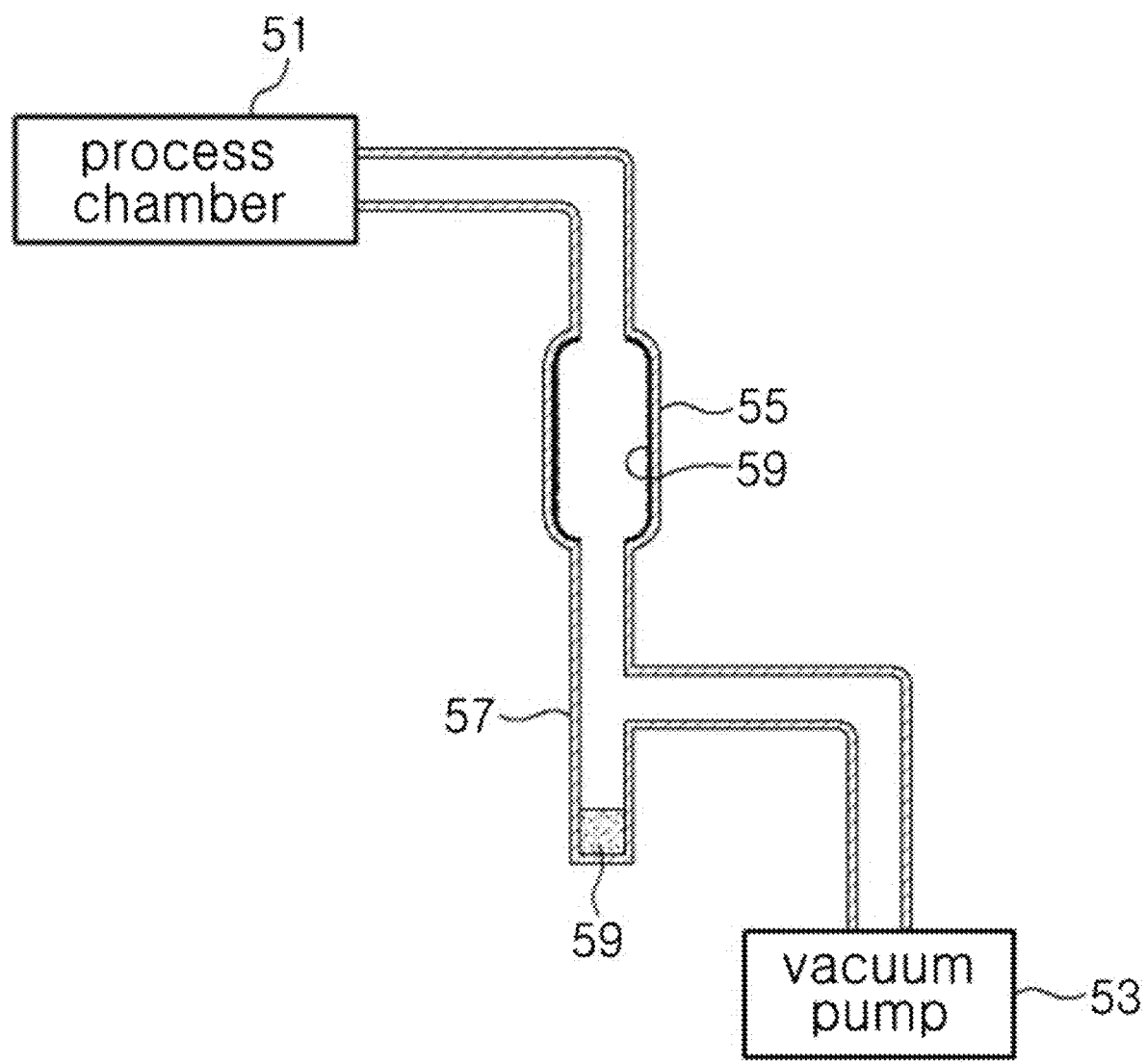
FIG. 11 is a schematic view illustrating a general system for collecting a by-product of the related art.

FIG. 8 is a view illustrating a temperature distribution inside the apparatus for collecting a by-product according to the embodiment of the present invention; FIG. 9 is a view illustrating a collecting tendency inside the apparatus for collecting a by-product according to the embodiment of the present invention; and FIG. 10 shows photographs of collected by-products in different regions of the apparatus for collecting a by-product according to the embodiment of the present invention.

A region indicated by "A" represents a region where a by-product is not collected and has a temperature distribution of 140° C. to 160° C. A region indicated by "B" represents a region where a high-density by-product is collected and has a temperature distribution of 60° C. to 140° C. A region indicated by "C" represents a region where a low-density porous by-product is collected and has a temperature distribution equal to or below 60° C. Accordingly, it can be known that the heat of the heater is distributed by the heat conduction plate of the heater such that the upper portion of the internal collecting tower has a uniform heat distribution and the high-density by-product is collected on the seed eliminating fins of the collecting tower cover efficiently. In addition, in accordance with changes of the semiconductor manufacturing process, although the amount of light gas of the exhaust gas supplied is larger than that of heavy gas, the high-density by-product is intensively collected at the upper portion efficiently and the low-density porous by-product is collected at the lower portion relatively by using the apparatus for collecting a by-product according to the present invention.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An apparatus for collecting a by-product in a semiconductor manufacturing process, the apparatus provided on a line between a process chamber and a vacuum pump to collect a by-product in exhaust gas, which is discharged from the process chamber, the apparatus comprising:

a housing receiving and discharging introduced exhaust gas and configured with a horizontal vortex plate on an inner wall thereof, the horizontal vortex plate generating a vortex;

an upper plate covering an upper portion of the housing and having a coolant flow path to maintain an appropriate temperature for protecting an 0-ring and for collecting a by-product;

an internal collecting tower configured inside the housing to be spaced above the bottom of the housing by a predetermined distance and provided with a collecting tower cover and a seed eliminating fin to extend a flow path and residence time of the exhaust gas in order to coagulate and collect a by-product;

a heater having a heat conduction plate to heat and uniformly distribute the exhaust gas flowing into the housing; and an extended discharging pipe configured to be extended to the inside of the internal collecting tower, thereby extending the flow path and residence time of the exhaust gas, and configured to discharge the exhaust gas to a gas outlet of a lower plate of the housing, wherein the internal collecting tower includes:

the collecting tower cover defining an external shape of the tower;

multiple seed eliminating fins provided at predetermined intervals along a circumference of side surfaces of the collecting tower cover to collect a by-product; and an inclined vortex plate assembled with the seed eliminating fins in a cross-set manner to generate a vortex.

2. The apparatus of claim 1, wherein the coolant flow path is provided in a region on the upper plate of the housing, which corresponds to an upper region of the seed eliminating fin provided on the collecting tower cover, to cool the exhaust gas inside the housing.

3. The apparatus of claim 1, wherein the heat conduction plate is configured to be extended toward a housing space portion farther from the heater eccentrically disposed in one side of the housing such that the exhaust gas in a space above the internal collecting tower is heated by the heat conduction plate.

4. The apparatus of claim 1, wherein the collecting tower cover has a box-shaped structure with the bottom thereof being open such that the collecting tower cover blocks the exhaust gas introduced from the gas inlet from directly flowing toward the gas outlet provided at the lower plate of the housing and the collecting tower cover guides the exhaust gas to flow into an inner space through a bottom opening and multiple side through-holes configured in lower portions of side surfaces of the collecting tower cover.

5. The apparatus of claim 1, wherein inclined slits are provided in multiple stages at each one side of the seed eliminating fins, and the inclined slits are configured by cutting obliquely at a predetermined inclination angle such that the inclined vortex plate is inserted therein.

6. The apparatus of claim 1, wherein the inclined vortex plate is configured with multiple slits in a longitudinal direction on a surface thereof, and the inclined vortex plate is provided in at least one stage on the seed eliminating fin provided on at least one side of short sides and long sides of the collecting tower cover.

7. The apparatus of claim 6, wherein, when the inclined vortex plate is provided in multiple stages, a lower stage inclined vortex plate is configured to protrude more outward than an upper stage inclined vortex plate.

8. The apparatus of claim 1, wherein, when the inclined vortex plate is provided in multiple stages, a lower stage inclined vortex plate is configured to protrude more outward than an upper stage inclined vortex plate.

9. An apparatus for collecting a by-product in a semiconductor manufacturing process, the apparatus provided on a line between a process chamber and a vacuum pump to collect a by-product in exhaust gas, which is discharged from the process chamber, the apparatus comprising:
- a housing receiving and discharging introduced exhaust gas and configured with a horizontal vortex plate on an inner wall thereof, the horizontal vortex plate generating a vortex;
- an upper plate covering an upper portion of the housing and having a coolant flow path to maintain an appropriate temperature for protecting an 0-ring and for collecting a by-product;
- an internal collecting tower configured inside the housing to be spaced above the bottom of the housing by a predetermined distance and provided with a collecting tower cover and a seed eliminating fin to extend a flow path and residence time of the exhaust gas in order to coagulate and collect a by-product;
- a heater having a heat conduction plate to heat and uniformly distribute the exhaust gas flowing into the housing; and
- an extended discharging pipe configured to be extended to the inside of the internal collecting tower, thereby extending the flow path and residence time of the exhaust gas, and configured to discharge the exhaust gas to a gas outlet of a lower plate of the housing, wherein the internal collecting tower includes:
- a lower horizontal supporting plate provided spaced a predetermined distance from the lower plate of the housing, fastened with the collecting tower cover disposed thereon, introducing the exhaust gas into the collecting tower cover while preventing leakage of a low-density porous by-product, and configured such that the extended discharging pipe is inserted in a predetermined position thereof; and
- a vertical plate and a horizontal plate that are provided in an upper portion of the collecting tower cover of the lower horizontal supporting plate in a lattice form to prevent leakage of the low-density porous by-product of the exhaust gas discharged to the extended discharging pipe, the vertical plate being configured with multiple vertical plate through-holes and the horizontal plate being configured with multiple horizontal plate through-holes.

10. The apparatus of claim 9, wherein the multiple vertical plate through-holes are configured on the vertical plate such that a vertical plate through-hole provided at a lower portion of the vertical plate is large and a vertical plate through-hole provided at an upper portion thereof is small.

11. The apparatus of claim 9, wherein the multiple horizontal plate through-holes are configured on the horizontal plate such that a horizontal plate through-hole located farther from the extended discharging pipe is large and a horizontal plate through-hole located closer to the extended discharging pipe is small.

12. The apparatus of claim 9, wherein at least one of the vertical plate and the horizontal plate is provided in multiple stages.

* * * * *